United States Patent [19]

Jinich et al.

[11] Patent Number: 5,298,869
[45] Date of Patent: Mar. 29, 1994

[54] CONSTANT CURRENT AND CONSTANT VOLTAGE REGULATING CIRCUIT FOR COMMON-GATE OR COMMON-BASE TRANSISTOR DEVICES

[75] Inventors: Leon Jinich, Plano; Truong V. Nguyen; R. Daniel Balusek, both of Garland, all of Tex.

[73] Assignee: Alcatel Network Systems, Inc., Richardson, Tex.

[21] Appl. No.: 964,725

[22] Filed: Oct. 22, 1992

[51] Int. Cl.$^5$ ............................................. H03F 3/62
[52] U.S. Cl. ................... 330/286; 307/296.6; 323/280; 330/277; 330/290; 330/297
[58] Field of Search ............... 330/56, 202, 277, 286, 330/287, 290, 297; 307/296.6; 323/265, 280, 281; 331/107 DP

[56] References Cited

FOREIGN PATENT DOCUMENTS 1282724 11/1968 Fed. Rep. of Germany ........ 330/56
94806 7/1981 Japan ................................. 330/297

*Primary Examiner*—James B. Mullins
*Attorney, Agent, or Firm*—Bruce C. Lutz; Dennis O. Kraft

[57] ABSTRACT

A circuit for maintaining a constant voltage across and constant current through an RF cavity includes a RF cavity comprising a common-gate or common-base transistor associated with a current control circuit maintains a constant current flowing through the RF cavity. The current control circuit has a current control BJT associated with the RF cavity and a resistor between the emitter of the current control BJT and the negative source voltage of the RF cavity. The current control BJT and resistor operate as a current source or sink as necessary to maintain a constant current flow through said RF cavity. A constant voltage regulation portion of the circuit maintains a constant voltage across the RF cavity and includes a zener reference diode and a voltage regulation BJT. The zener reference diode has an associated isolation operational amplifier circuit for isolating the zener reference diode from current fluctuations at the source while permitting the zener reference diode to respond to voltage difference changes across the RF cavity. The zener reference diode and voltage regulation BJT control voltage applied to the RF cavity. The current control circuit and constant voltage regulation circuit automatically maintain a constant current passing through and constant voltage difference across the RF cavity.

8 Claims, 3 Drawing Sheets

CONSTANT CURRENT AND CONSTANT VOLTAGE REGULATING CIRCUIT FOR COMMON-GATE OR COMMON-BASE TRANSISTOR DEVICES

TECHNICAL FIELD OF THE INVENTION

The present invention is concerned generally electronic circuits and more particularly with circuits for regulating electronic circuits. Even more specifically, the invention is concerned with a constant current and constant voltage regulating circuit for common-gate or common-base transistor devices that automatically improves the performance of the associated transistor devices in terms not only of current and voltage control, but also in terms of phase noise reduction through the transistor devices.

BACKGROUND OF THE INVENTION

Field of the Invention

For a variety of electronic circuits, it is necessary, or at least desirable, that field effect transistors (FETs) be connected in a common-gate configuration or that bipolar junction transistors (BJTs) be connected in a common-base configuration. These applications include high-frequency oscillator designs as well as various amplifier applications. High-frequency oscillator designs include tuned resonance cavities that either use a common-gate FET or common-base BJT as the active device. Amplifier applications include power amplifiers and low-noise amplifiers.

Description of Related Art

As opposed to the common-source or common-emitter transistor configurations that are easily automatically controlled, a common-gate or common-base transistor configuration conventionally requires manual adjustment of drain-to-source or collector-to-emitter voltage and current, as appropriate, to cause the transistor device to operate at the desired point on the transistor characteristic curve. Manual voltage and current control operations typically require the use of several variable resistance potentiometers as well as tests for selected resistance values. In some applications, the use of multiple resistors with associated bond wire attachments are used to incrementally change voltage values across the transistors. As the bond wires are selectively disconnected, the transistor voltage values change. Because these circuits are temperature sensitive according to a temperature coefficient that is inherent with the circuit, temperature must also be compensated to provide stable operation of the common-gate or common-base transistor devices.

Yet another characteristic of common-gate or common-base transistor devices is phase noise generation due to current flowing through the gate or base, respectively. For these devices, phase noise in the circuit can adversely affect devices operating as RF cavities for high-frequency oscillator designs, as well as devices operating as power or low-noise amplifiers.

It is an object of the present invention, therefore, to provide a circuit that automatically maintains a constant current and constant voltage across the transistor device that is connected in a common-gate configuration for a FET or a common-base configuration for a BJT.

It is an object of the present invention to provide a consistent manufacturing bias condition within the common-gate or common-base transistor device that avoids the problems associated with manual voltage and current control.

SUMMARY OF THE INVENTION

The present invention provides a constant current source and a constant voltage regulation circuit that overcomes limitations and problems associated with prior manual methods and apparatuses for current and voltage control. The transistor device, therefore, becomes an automatically regulated transistor device. The current control portion of the circuit of the present invention includes a current control BJT associated with the FET source or the BJT emitter of the regulated transistor device and a resistor associated between the current control BJT emitter. The current control circuit operates as current source or sink, as necessary, to maintain a constant current through the regulated transistor device.

The constant voltage regulation portion of the circuit of the present invention maintains a constant voltage through the regulated transistor device and includes a zener reference diode and a voltage regulation BJT. The zener reference diode has an associated isolation operational amplifier that isolates the zener reference diode from current fluctuations at the source or emitter, as appropriate, of the regulated transistor device. At the same time, the isolation operational amplifier permits the zener reference diode and the associated voltage regulation BJT to sense voltage differences across the regulated transistor device. The zener reference diode associates with the base of the voltage regulation BJT to control voltage applied to the drain or collector, as appropriate, of the regulated transistor device. This maintains a constant voltage across the regulated transistor device. The constant voltage regulation circuit further comprises a constant voltage source that is applied in parallel to the collector of the voltage regulation BJT and a minimum current flow resistor. The minimum current flow resistor associates with the cathode of the zener reference diode and with the base of the voltage regulation BJT to maintain a minimum level of current flowing through the zener reference diode as well as to bias the voltage regulation BJT. The minimum level of current maintains the zener reference diode in a stable mode of operation. By using the constant current source and the constant voltage regulation circuit, the present invention automatically maintains a constant current flowing through and constant voltage difference across the regulated transistor device.

It, therefore, is an object of the present invention to eliminate variations that arise in a common-gate or common-base transistor device due to electrical characteristics of the device and tuning technique variations between different technicians that may manually adjust the transistor device. By automatically maintaining a constant current through and a constant voltage across the transistor device, the present invention permits constant bias conditions through the transistor device that assure device operation at preferred regions of the transistor characteristic curve.

It is also an object of the present invention to eliminate the multiple manual control parameters of temperature, voltage, and current by making voltage and current control automatic. Therefore, only manual control of temperature compensation is necessary for common-gate or common-base transistor devices that employ the present invention.

It is a further object of the present invention to provide an inventive approach that will maintain constant current through the transistor device so that, for example, an oscillator circuit that employs the present invention will not be adversely affected by load variations and will always operate in a desired operating bias region.

BRIEF DESCRIPTION OF THE DRAWINGS

Other objects and advantages will be apparent from a reading of the specification and appended claims in conjunction with the drawings, wherein:

FIGS. 4 and 5 illustrate comparative results indicating phase noise reduction for an oscillator circuit that employs the preferred embodiment of the present invention.

DETAILED DESCRIPTION OF THE INVENTION

Figure 1:
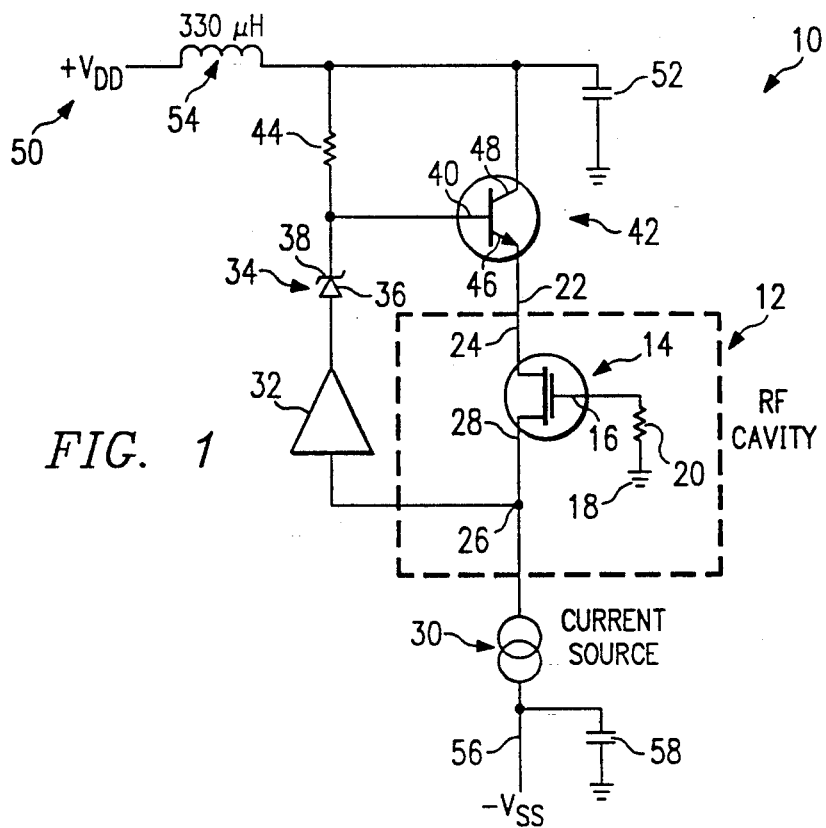
FIG. 1 provides a schematic block diagram of the preferred embodiment of the present invention.

In FIG. 1, current and voltage control circuit 10 includes and controls, for example, RF cavity 12 that contains GaAs field effect transistor (FET) 14. FET 14 has a common-gate configuration so that gate 16 is connected to common or ground 18 through resistor 20. Other connections to FET 14 include drain connection 22 to drain 24 and source connection 26 to source 28. Connecting to source connection 26 are current source 30 and isolation circuit 32. Zener reference diode 34 connects its anode 36 to isolation circuit 32 zener reference diode 34 cathode 38 is connected in parallel with base 40 of voltage regulation bipolar junction transistor (BJT) 42 and minimum current resistor 44. Voltage regulation BJT 42 has its emitter 46 connected to drain 22 of FET 14 and its collector 48 connected to drain voltage source $+V_{DD}$ 50 in parallel with minimum current flow resistor 44 and ground coupling capacitor 52. Isolation inductor 54 isolates constant current and voltage circuit 10 from undesirable fluctuations associated with drain voltage source 50. Current source 30 associates with source connection 26 to maintain a constant current flow through RF cavity 12. Connections to current source 30 include negative source voltage $-V_{SS}$, connection 56 and coupling capacitor 58 to ground.

Figure 2:
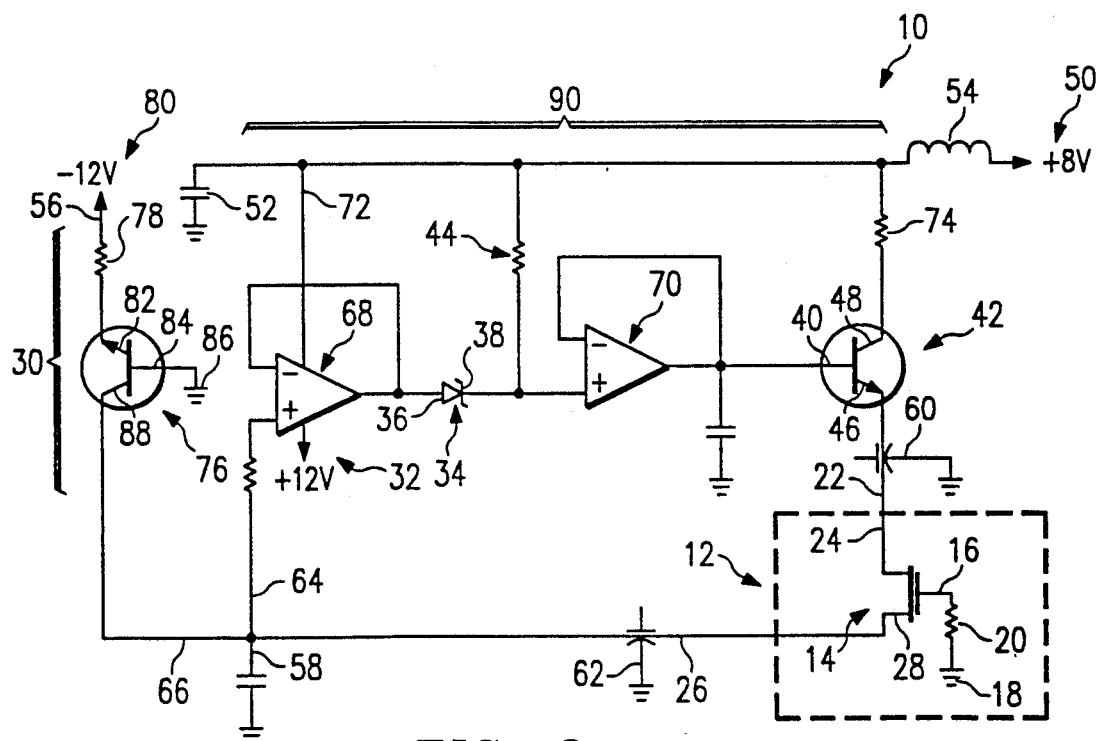
FIG. 2 provides a more detailed circuit diagram of the preferred embodiment of the present invention.

In FIG. 2, the simplified schematic block diagram of FIG. 1 is provided more specifically. RF cavity 12, again, contains FET 14. RF cavity 12 may alternatively use a BJT instead of a FET. FET 14 includes gate 16 that connects to common or ground 18 through resistor 20. At drain connection 22, drain 24 connects and at source connection 26, source 28 connects. The detailed schematic of FIG. 2 further illustrates RF interference feed through filters 60 at drain connection 22 and RF interference feed through 62 at source connection 26. RF interface feed through 60 and 62 are capacitive couplings that isolate RF interference within RF cavity 12 from the remaining portion of circuit 10. Source connection 26 connects in parallel to line 64, line 66 and the line to coupling capacitor 58. Line 64 goes to isolation circuit 32 that includes isolation operational amplifier 68 and isolation operational amplifier 70. Zener diode 34 is positioned between isolation operational amplifiers 68 and 70. Operational amplifier 70 connects to base 40 of voltage regulation BJT 42. The emitter of voltage regulation BJT 42 connects to drain 24 of FET 14 through drain connection 22. Connecting in parallel to drain voltage 50 through isolation inductor 54 are (1) bypass capacitor 52, (2) bias voltage line 72 for operational amplifier 68, (3) minimum current resistor 44 to cathode 38 of zener reference diode 34 and to isolation operational amplifier 70, and (4) 10-$\Omega$ current monitoring resistor 74 that connects to collector 48 of voltage regulation BJT 42.

Line 66 that taps from source connection 26 goes to current source 30. Current source 30 includes current control BJT 76 and 370-$\Omega$ resistor 78. The 370-$\Omega$ resistor 78 connects between line 56 to $-12$ V source voltage 80 and emitter 82 of current control BJT 76. Current control BJT 76 has its base 84 connected to ground 86 and its collector 88 connected to line 66.

Association of isolation operational amplifier 68, zener reference diode 34, and voltage regulation BJT 42, at a minimum, formulate voltage control circuit 90 of constant current and constant voltage circuit 10. The object of voltage control circuit 90 is to maintain a continuous voltage drop from drain to source at FET 14 of RF cavity 12. The object of current source circuit 30 is to maintain a constant current through FET 14 of RF cavity 12. This provides a way to monitor the voltage at source 28 of FET 14 and, according to the characteristics of FET 14 (i.e., the associated transconductance and drain-to-source saturated current), to feedback the voltage seen at source 28 to zener reference diode 34 and voltage regulation BJT 42 to appropriately adjust the voltage at drain 24 of FET 14. The association of zener reference diode 34 and voltage regulation BJT 42 assures, in the exemplary case of FIG. 2, that a +4.0 V is maintained between drain 24 and source 28 of FET 14. This is done by zener reference diode 34 maintaining a voltage of 4.7 V at cathode 38. Isolation operational amplifier 70 provides the constant 4.7 V potential to base 40 of voltage regulation BJT. The base-to-emitter voltage drop of voltage regulation BJT 42 is 0.7 V. This causes the voltage seen at emitter 46 to be the desired 4.0 V. Thus, the combination of zener reference diode 34 and voltage regulation BJT 42 operates as a series pass regulator to maintain a constant voltage drop across FET 14 in RF cavity 12.

For constant current and voltage control circuit 10, it is also desired to maintain the drain-to-source current through FET 14. This is done by adding to source connection 26 an active device that operates as a current source or current sink as necessary to maintain constant current. In the preferred embodiment, current control BJT 76 fixes or regulates the current so that the current that passes through FET 14 begins at $+8$ V drain current source 50 and flows through isolation inductor 54, through current monitoring resistor 74, through voltage regulation BJT 42, through FET 14, through current control BJT 76, and finally through 370-$\Omega$ resistor 78 to negative source voltage 80. Since the base of current control BJT 76 is grounded, emitter 82 has a voltage of approximately 0.7 V. This causes the voltage drop to be $-12$ V minus the existing base-to-voltage drop in current control BJT 76. The current that results from current source 30 is the current that is due to the voltage drop across 370-$\Omega$ resistor 78. This voltage drop sets the current drain through voltage regulation BJT 42 and FET 14 so that the current is fixed and fairly constant. The base-to-emitter voltage drop across current control BJT 76 is relatively constant and does not vary to the same degree that the drain-to-source saturated current drops across FET 14.

In summary, the combination of zener reference diode 34 and voltage regulation BJT 42, together with isolation operational amplifiers 68 and 70 operate as a series pass regulator circuit to govern or control the voltage across RF cavity 12. At the same time and as a result of current source 30, constant current is maintained from +8-V drain voltage 50 through and to −12-V source voltage 80.

Isolation operational amplifier 68 is necessary to isolate zener reference diode 34 from source connection 26 to prevent large current variations at source connection 26 from affecting how zener reference diode senses the drain-to-source voltage differences. Isolation operational amplifier 70, however, is optional to provide some buffering in the emitter-follower and source-follower circuits that voltage regulation BJT 42 and FET 14 form. In an example used to perform the preferred embodiment, an available isolation operational amplifier was packaged with both isolation operational amplifier 68 and 70. Therefore, the preferred embodiment uses both operational amplifier 68 and 70 for improved isolation.

Isolation inductor 54 has a value of approximately 330 MH and blocks undesirable signals or other fluctuations that may come from the power circuit associated to provide drain voltage 50. Current monitoring resistor 74, in the exemplary embodiment, has a value of 10-Ω and, although it does not serve necessarily to improve current control or voltage regulation, 10-Ω current monitoring resistor 74 provides a "safety net" for circuit 10. As such, if a short circuit occurs within RF cavity 12 on drain 24 or source 28 of FET 14, instead of voltage regulator BJT 42 delivering an infinite current until resistor 20 burns up, 10-Ω current monitoring resistor 74 causes a current drop that eventually saturates voltage regulation BJT 42 causing it to turn off. This will limit the absolute maximum of current that passes through RF cavity 12 to protect the circuit between +8-V drain voltage 50 and −12-V source voltage 80.

Figure 3:
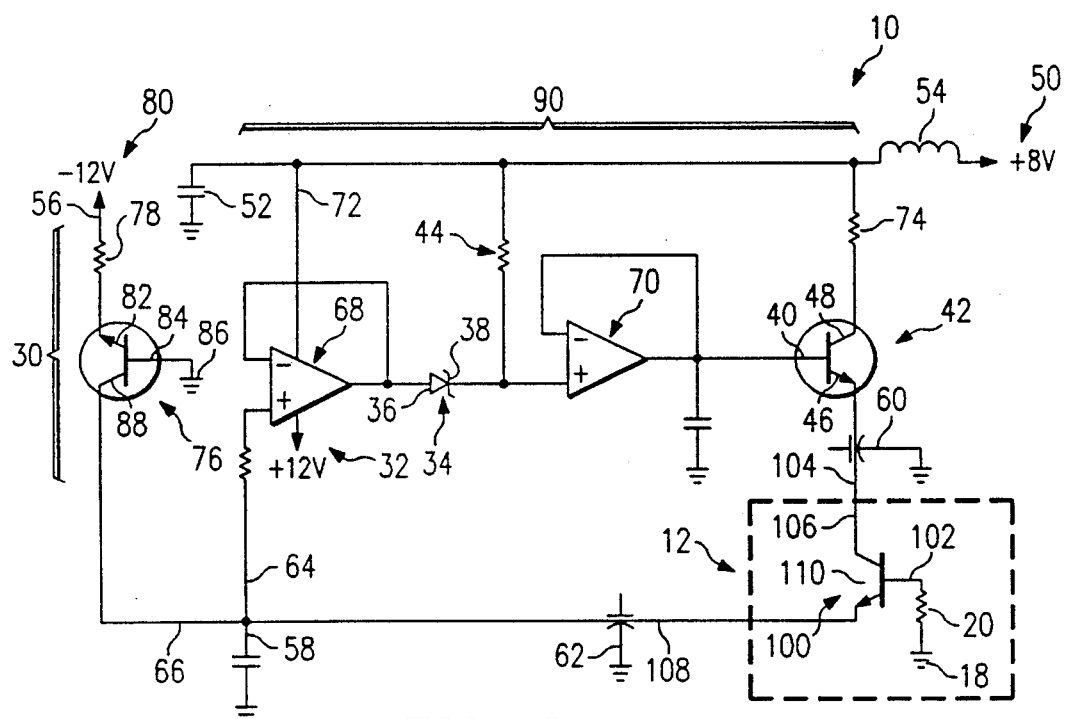
FIG. 3 provides a more detailed circuit diagram of another embodiment of the present invention.
Figure 3:
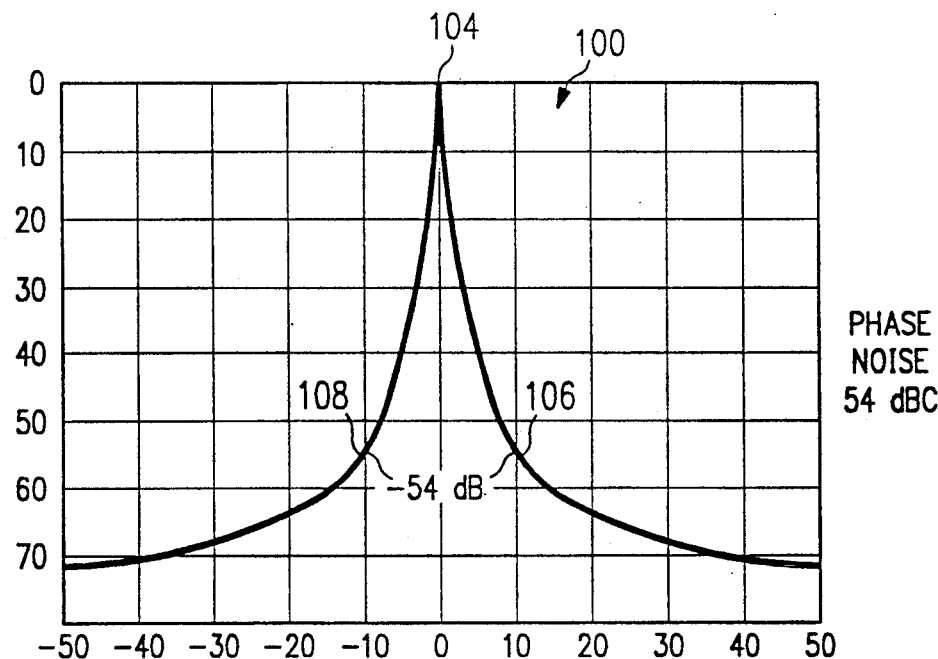

In FIG. 3, the simplified schematic block diagram of FIG. 1 is provided more specifically, and wherein RF cavity 12 contains transistor 100. Transistor 100 includes base 102 that connects to common or ground 18 through resistor 20. At collector connection 104, collector 106 connects, and at emitter connection 108, emitter 110 connects. All other connections of FIG. 3 are the same as those for FIG. 2. Additionally, the constant voltage across and constant current through RF cavity 12 is accomplished as described above for FIGS. 1 and 2.

Figure 4:
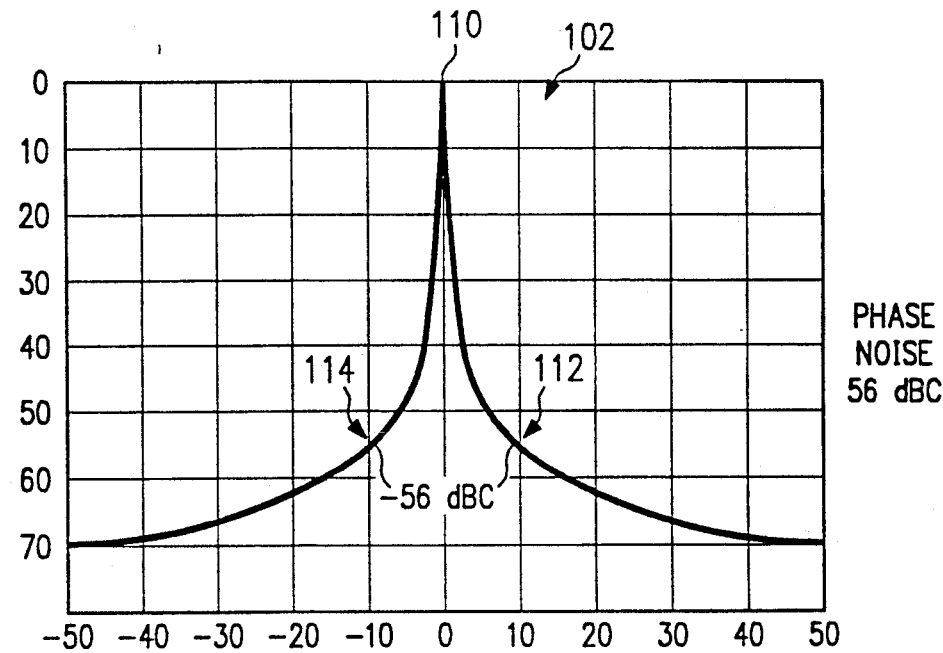

Because constant current flows through RF cavity 12, a phase noise improvement results. This is visible through the results that FIGS. 4 and 5 show. FIGS. 4 and 5 illustrate results obtained through operation of an oscillator that employs RF cavity 12. The oscillator of FIGS. 4 and 5 has an output frequency of 10.796 GHZ and output power of 8.8 dBm. The drain-to-source current in the oscillator FET is 30 mA in a non-oscillator operational mode and 35.8 mA in an oscillator mode of operation. The drain-to-source voltage is 4.0 V. FIG. 4 shows the use of constant voltage reference circuit 90 to constantly maintain the drain-to-source voltage across with RF cavity 12. FIG. 5 shows the results obtained with both constant voltage circuit 90 and current source 30 to provide a constant current and voltage control circuit for RF cavity 12. Curve 100 of FIG. 4 and curve 102 of FIG. 5 are plots of frequency spectrum versus power. The peeks 104 and 110 of curves 100 and 102, respectively, illustrate inverse frequency or 1/F curves.

FIGS. 4 and 5 provide measures of phase noise for a standard set of conditions in an oscillator circuit. To measure the phase noise, it is common to look at phase noise 10 KHz away from center frequency, i.e., ±10 KHz from the center frequency of 10.796 GHz. For example, a specification for an oscillator circuit may require that the 1/F noise be no higher or greater than a certain value at a frequency difference of ±10 KHz from the center frequency. By measuring the distance between the peaks 104 and 110 on respective curves 100 and 102 at the ±10 KHz offset, it is possible to determine whether the phase noise falls below a certain number. For example, in FIG. 4, the divisions from the center frequency peaks 104 and 110 of FIGS. 4 and 5 respectively, are 10 KHz increments. In FIG. 4, it is clear that the phase noise has a difference of 54 dB at the ±10 KHz offset, i.e., at the points designated by reference numerals 106 and 108. In other words, points 106 and 108 are 54 dBm lower than the center frequency peak. FIG. 5 shows that with the combined current source circuit 30 and voltage reference circuit 90 the preferred embodiment results in a greater phase difference of 56 dB from the center peak frequency at the ±10 KHz offset, i.e., at the points designated by reference numerals 112 and 114. This results in a further reduction in phase noise of 2 dBm as a result of the combined circuit of the present invention. This 2-dB improvement indicates a roughly 50% phase-noise reduction compared to not using the combined circuit.

OPERATION

The operation of the present concept is believed reasonably straight forward once the concept is understood. Constant current and constant voltage circuit 10 maintains a constant current through and voltage difference across RF cavity 12 by monitoring the voltage at source 28 and providing a feedback voltage difference to drain 22 of FET 14 using the combination of zener reference diode 34 and voltage regulation BJT 42. Additionally, to maintain the constant current flow between the +8-V drain voltage 50 and −12-V source voltage 80, the preferred embodiment uses current source 30 that includes the current control BJT 76 and 370-Ω resistance 78. To maintain a constant drain-to-source potential by operating voltage regulation BJT 42 as a series pass regulator, zener reference diode 34 maintains a constant 4.7-V difference between source line 26 and voltage regulation BJT base 40. Voltage regulation BJT 42 has a 0.7-V base-to-emitter voltage drop. This voltage drop causes voltage regulation BJT 42 to maintain a constant 4.0-V drain-to-source voltage difference. At the same time, current control BJT 76 and 370-Ω resistor act as a current source or sink, as necessary, to maintain a constant current flow through circuit 10.

By associating constant voltage reference circuit 90 and current source circuit 30 with RF cavity 12, the preferred embodiment automatically maintains a constant drain-to-source voltage difference across and a constant current flow through RF cavity 12. This eliminates the need for manually-operated current and voltage potentiometers to adjust these parameters in the common-gate transistor device. Therefore, more constant performance results in RF cavity 12 and operator error is essentially eliminated. Although RF cavity 12 will change its characteristics as a function of temperature, the fact that voltage and current are automatically controlled in the present invention eliminates significant amounts of temperature compensation potentiometer adjustment that conventional common-base transistor devices require.

While I have described the concept of the present invention with respect to GaAs FET in a RF cavity, it is to be realized that this concept can apply to any transistor device in a variety of applications, including other FETs, one of many types of BJTs, or even a high-electron-mobility transistor (HEMT) used for oscillator applications, as well as transistor devices used as power and low noise applications. The basic concept of an automatic current and voltage reference circuit for a transistor device can be applied to an almost endless variety of transistor applications to form a regulated transistor device. I, therefore, wish to be limited not by the specific invention embodiment illustrated and described above, but only by the scope of the inventive concept of automatically controlling both the current through and voltage difference across a transistor device by using in conjunction a current control circuit associated with the transistor device to maintain a constant current flowing through the transistor device where the current controlled circuit comprises a current control transistor associated with the regulated transistor device and a resistor associated with the current control transistor, and, further, where the current control transistor and the resistor associate to operate as a current source or sink as necessary to maintain a constant current flow through the regulated transistor device and further, where the constant voltage regulation circuit maintains a constant voltage across the regulated transistor device and where the constant voltage regulation circuit comprises a zener reference diode and a voltage regulation transistor.

We claim:

1. A method for maintaining a constant voltage across and constant current through an RF cavity, comprising the steps of:
   generating a voltage across and a current through said RF cavity with a common-gate transistor having a source and a drain;
   automatically maintaining a constant current flowing through said RF cavity using a current control circuit associated with said source to operate as a current source or sink as necessary to maintain a constant current flow through said RF cavity;
   automatically maintaining a constant voltage across said RF cavity using a constant voltage regulation circuit comprising a zener reference diode and a voltage regulation BJT; and
   isolating said zener reference diode from current fluctuations at said source while permitting said zener reference diode to respond to voltage difference changes across said RF cavity.

2. A circuit for maintaining a constant voltage across and constant current through an RF cavity, comprising:
   a common-gate transistor in said RF cavity, said common-gate transistor having a source and a drain;
   a current control circuit associated with said source to maintain a constant current flowing through said RF cavity, said current control circuit comprising a current control BJT associated with said source and a resistor associated between the emitter of said current control BJT and a source voltage, said current control BJT and said resistor associated to operate as a current source or sink as necessary to maintain a constant current flow through said RF cavity;
   a constant voltage regulation circuit for maintaining a constant voltage across said RF cavity and comprising a zener reference diode and a voltage regulation BJT, said zener reference diode having an associated isolation operational amplifier circuit for isolating said zener reference diode from current fluctuations at said source while permitting said zener reference diode to respond to voltage difference changes across said RF cavity, said zener reference diode further associated with the base of said voltage regulation BJT for controlling voltage applied to said drain to maintain a constant voltage across said RF cavity, said constant voltage regulation circuit further comprising a constant voltage source applied to the collector of said voltage regulation BJT and a minimum current flow resistor associated between the cathode of said zener reference diode and said constant voltage source and between the base of said voltage regulation BJT and said constant voltage source; and
   said current control circuit and said constant voltage regulation circuit associated to automatically maintain a constant current passing through and constant voltage difference across said RF cavity.

3. A method for maintaining a constant voltage across and constant current through a regulated transistor device, comprising the steps of:
   generating a voltage across and current through said transistor device comprising a common-gate transistor;
   maintaining a constant current flowing through said transistor device by operating current control means as a current source or sink as necessary to maintain a constant current flow through said transistor device;
   maintaining a constant voltage across said transistor device using constant voltage regulation means comprising a zener reference diode and a voltage regulation transistor for responding to voltage difference changes across said transistor device; and
   automatically maintaining a constant current passing through and constant voltage difference across said transistor device by associating said current control means with said constant voltage regulation means.

4. A circuit for maintaining a constant voltage across and constant current through a regulated transistor device, comprising:
   said transistor device comprising a common-gate transistor;
   current control means for maintaining a constant current flowing through said transistor device, said current control means associated with said transistor device to operate as a current source or sink as necessary to maintain a constant current flow through said transistor device;
   constant voltage regulation means for maintaining a constant voltage across said transistor device and comprising a zener reference diode and a voltage regulation transistor for responding to voltage difference changes across said transistor device;
   said current control means and said constant voltage regulation means associated to automatically maintain a constant current passing through and constant voltage difference across said transistor device.

5. A method for maintaining a constant voltage across and constant current through a power amplifier circuit having a power amplifier transistor comprising the steps of:
  generating a voltage and a current using said power amplifier transistor comprising a common-gate transistor having a source and a drain;
  maintaining a constant current flowing through said power amplifier transistor using current control circuit associated with said source, by associating a current control BJT with said source and a resistor between the emitter of said current control BJT and a source voltage, and further by operating said current control BJT and said resistor as a current source or sink as necessary to maintain a constant current flow through said power amplifier transistor;
  maintaining a constant voltage across said power amplifier transistor using a constant voltage regulation circuit comprising a zener reference diode and a voltage regulation BJT so that said zener reference diode associates with the base of said voltage regulation BJT for controlling voltage applied to said drain to maintain a constant voltage across said power amplifier transistor, said constant voltage regulation circuit further comprising a constant voltage source applied to the collector of said voltage regulation BJT and a minimum current flow resistor associated between the cathode of said zener reference diode and said constant voltage source and between the base of said voltage regulation BJT and said constant voltage source; and
  automatically maintaining a constant current passing through and constant voltage difference across said power amplifier transistor by using said current control means in association with said constant voltage regulation circuit.

6. A power amplifier circuit for maintaining a constant voltage across and constant current through a power amplifier transistor comprising:
  said power amplifier transistor comprising a common-gate transistor having a source and a drain;
  a current control circuit associated with said source to maintain a constant current flowing through said power amplifier transistor, said current control circuit comprising a current control BJT associated with said source and a resistor associated between the emitter of said current control BJT and a source voltage, said current control BJT and said resistor associated to operate as a current source of sink as necessary to maintain a constant current flow through said power amplifier transistor;
  a constant voltage regulation circuit for maintaining a constant voltage across said power amplifier transistor and comprising a zener reference diode and a voltage regulation BJT, said zener reference diode associated with the base of said voltage regulation BJT for controlling voltage applied to said drain to maintain a constant voltage across said power amplifier transistor, said constant voltage regulation circuit further comprising a constant voltage source applied to the collector of said voltage regulation BJT and a minimum current flow resistor associated between the cathode of said zener reference diode and said constant voltage source and between the base of said voltage regulation BJT and said constant voltage source; and
  said current control circuit and said constant voltage regulation circuit associated to automatically maintain a constant current passing through and constant voltage difference across said power amplifier transistor.

7. A method for maintaining a constant voltage across and constant current through a low-noise amplifier circuit using a low-noise amplifier transistor, comprising the steps of:
  generating a voltage and current using said low-noise amplifier transistor comprising a common-base transistor having an emitter and a collector;
  maintaining a constant current flowing through said low-noise amplifier transistor using a current control circuit associated with said emitter and comprising a current control transistor associated with said emitter and a resistor associated between said current control transistor and a source voltage so as to operate as a current source or sink as necessary to maintain a constant current flow through said low-noise amplifier transistor;
  maintaining a constant voltage across said low-noise amplifier transistor using a constant voltage regulation circuit comprising a zener reference diode and a voltage regulation transistor while isolating said zener reference diode from current fluctuations at said emitter and permitting said zener reference diode to respond to voltage difference changes across said low-noise amplifier transistor, and further associating said zener reference diode with said voltage regulation transistor for controlling voltage applied to said collector to maintain a constant voltage across said low-noise amplifier transistor; and
  associating said current control circuit and said constant voltage regulation circuit further to automatically maintain a constant current passing through and constant voltage difference across said low-noise amplifier transistor.

8. A low-noise amplifier circuit for maintaining a constant voltage across and constant current through a low-noise amplifier transistor comprising:
  said low-noise amplifier transistor comprising a common-base transistor having an emitter and a collector;
  a current control circuit associated with said emitter to maintain a constant current flowing through said low-noise amplifier transistor, said current control circuit comprising a current control transistor associated with said emitter and a resistor associated between said current control transistor and a source voltage, said current control transistor and said resistor associated to operate as a current source of sink as necessary to maintain a constant current flow through said low-noise amplifier transistor;
  a constant voltage regulation circuit for maintaining a constant voltage across said low-noise amplifier transistor and comprising a zener reference diode and a voltage regulation transistor, said zener reference diode isolated from current fluctuations at said emitter while permitting said zener reference diode to respond to voltage difference changes across said low-noise amplifier transistor, said zener reference diode further associated with said voltage regulation transistor for controlling voltage applied to said collector to maintain a constant voltage across said low-noise amplifier transistor, said constant voltage regulation circuit further comprising a constant voltage source applied to said voltage regulation transistor and a minimum current flow resistor associated between the cathode of said zener reference diode and said constant voltage source and between said voltage regulation transistor and said constant voltage source; and said current control circuit and said constant voltage regulation circuit associated to automatically maintain a constant current passing through and constant voltage difference across said low-noise amplifier transistor.

* * * * *

UNITED STATES PATENT AND TRADEMARK OFFICE
CERTIFICATE OF CORRECTION

PATENT NO. : 5,298,869
DATED : March 29, 1994
INVENTOR(S) : Jinich, et al

It is certified that error appears in the above-indentified patent and that said Letters Patent is hereby corrected as shown below:

Column 4, line 54, after "drain" delete "current" and insert -- voltage --.

Column 10, line 56, after "source" delete "of" and insert -- or --.

Signed and Sealed this

Twenty-sixth Day of September, 1995

Attest:

BRUCE LEHMAN

*Attesting Officer*    *Commissioner of Patents and Trademarks*